US006424734B1

(12) United States Patent
Roberts et al.

(10) Patent No.: US 6,424,734 B1
(45) Date of Patent: Jul. 23, 2002

(54) FIDUCIAL MARK SEARCH USING SUB-MODELS

(75) Inventors: Karen J. Roberts, Natick; Karen B. Sarachik, Newton, both of MA (US)

(73) Assignee: Cognex Corporation, Natick, MA (US)

( * ) Notice: Subject to any disclaimer, the term of this patent is extended or adjusted under 35 U.S.C. 154(b) by 0 days.

(21) Appl. No.: 09/285,626

(22) Filed: Apr. 3, 1999

Related U.S. Application Data

(60) Provisional application No. 60/080,701, filed on Apr. 3, 1998.

(51) Int. Cl.[7] .............................. G06K 9/00; G06K 9/68

(52) U.S. Cl. ...................................... 382/151; 382/218

(58) Field of Search ................................. 382/141, 144, 382/145, 146, 147, 148, 149, 150, 151, 103, 209, 217, 218; 346/23; 345/441, 420

(56) References Cited

U.S. PATENT DOCUMENTS

| | | | |
|---|---|---|---|
| 4,980,971 A | 1/1991 | Bartschat et al. ............. 29/833 |
| 5,060,276 A | 10/1991 | Morris et al. ................ 382/151 |
| 5,113,565 A | 5/1992 | Cipolla et al. ............. 29/25.01 |
| 5,226,095 A | 7/1993 | Okumura et al. ........... 382/151 |
| 5,268,999 A | 12/1993 | Yokoyama ................... 345/441 |
| 5,343,028 A | 8/1994 | Figarella et al. ........ 235/462.09 |
| 5,371,690 A | 12/1994 | Engel et al. ................. 382/151 |
| 5,471,541 A | 11/1995 | Burtnyk et al. ............. 382/153 |
| 5,495,537 A | 2/1996 | Bedrosian et al. .......... 382/209 |
| 5,497,451 A | 3/1996 | Holmes ....................... 345/420 |
| 5,500,906 A | 3/1996 | Picard et al. ................ 382/220 |
| 5,545,887 A | 8/1996 | Smith et al. ............ 235/462.08 |
| 5,602,937 A | 2/1997 | Bedrosian et al. .......... 382/151 |

(List continued on next page.)

OTHER PUBLICATIONS

Cognex Corporation, "Chapter 5 Fiducial Finder," *Cognex 4000/5000 SMD Placement Guidance Package User's Manual*, pp. 179–223, Release 3.2 590–0139, Natick, MA, USA, 1996.

Cognex Corporation, "Chapter 7 Rectilinear Device Inspection," *Cognex 4000/5000 SMD Placement Guidance Package User's Manual*, pp. 269–310, Release 3.2 590–0139, Natick, MA, USA, 1996.

Hoogs et al., "Model–Based Learning of Segmentations", IEEE, pp. 494–499, 1996.

(List continued on next page.)

*Primary Examiner*—Amelia M. Au
*Assistant Examiner*—Mehrdad Dastouri
(74) *Attorney, Agent, or Firm*—Russ Weinzimmer

(57) ABSTRACT

A method is disclosed for finding a pose of a geometric model of a fiducial mark within an image of a scene containing the fiducial mark. The method includes receiving input from a user including geometric model shape information and geometric model dimensions, selecting a pre-defined model having sub-models by using the model shape information, the pre-defined model being parameterized by the geometric model dimensions; and then using the pre-defined model to find an image of the fiducial mark in the image of the scene. The act of selecting a pre-defined model having sub-models includes pre-defining a model such that the sub-models and the relationships among the sub-models are selected by exploiting knowledge of features and properties of the fiducial sought so as to provide more accurate location of the fiducial. The invention provides enhanced ease of use of a sub-model-based search method by requiring only the shape and dimensions of the fiducial sought. An appropriate model and it's sub-models are automatically provided. The model and it's sub-models are particularly appropriate to the application when they are based on knowledge of the variability of the fiducial, and other aspect of the behavior of the fiducial throughout a manufacturing process, for example.

1 Claim, 9 Drawing Sheets

U.S. PATENT DOCUMENTS

| | | | |
|---|---|---|---|
| 5,621,807 A | | 4/1997 | Eibert et al. ................. 382/103 |
| 5,625,715 A | | 4/1997 | Trew et al. .................. 382/236 |
| 5,627,912 A | | 5/1997 | Matsumoto ................. 382/146 |
| 5,627,915 A | | 5/1997 | Rosser et al. ............... 382/219 |
| 5,663,809 A | | 9/1997 | Miyaza et al. .............. 358/450 |
| 5,696,838 A | * | 12/1997 | Chiu et al. .................. 382/159 |
| 5,828,769 A | | 10/1998 | Burns .......................... 382/118 |
| 5,845,288 A | | 12/1998 | Syeda-Mahmood ......... 707/102 |
| 5,850,469 A | | 12/1998 | Martin et al. ............... 382/154 |
| 5,859,923 A | * | 1/1999 | Petry, III et al. ........... 382/141 |
| 5,974,169 A | | 10/1999 | Bachelder ................... 382/151 |
| 6,178,262 B1 | * | 1/2001 | Picard et al. ............... 382/141 |

OTHER PUBLICATIONS

Medina–Mora, R., "An Incremental Programming Environment," *IEEE Transactions on Software Engineering*, Sep. 1981, pp. 472–482, vol. SE–7, No. 5, USA.

Newman et al., "3D CAD–Based Inspection I: Coarse Verification", IEEE, pp. 49–52, 1992.

Ullman, S., "Aligning pictorial descriptions: An approach to object recognition, I: Approaches to Object Recognition," reprinted from *Cognition*, pp. 201–214, vol. 32, No. 3, Cambridge, MA, USA, Aug. 1989.

* cited by examiner

Sub-model Table

| label | position (rigid) trans | angle | storage |
|---|---|---|---|
| 0 | (0, +h/2) | ρ/2-90 | |
| 1 | (-w/2, -h/2) | 180 | |
| 2 | (+w/2, -h/2) | θ | |

Model Storage

Normalized Models | Image Search models
--- | ---
△ | Trained PatQuick model
0.75 L ⋀ 0.75 L | Trained PatMax model
0.75 w → 0.75 L | Trained PatMax model
0.75 L ↑ 0.75 w | Trained PatMax model

Sub-model Table

Model Storage

Normalized Models   Image Search models

| label | position (rigid) | | storage |
| --- | --- | --- | --- |
| | trans | angle | |
| 1 | (-w/2, 0) | $\theta/2 - 180$ | |
| 3 | (+w/2, 0) | $\theta/2$ | |
| 0 | (0, +h/2) | $\theta/2 - 90$ | |
| 2 | (0, -h/2) | $\theta/2 + 90$ | |

Model Storage

Sub-model Table

| label | position (rigid) | | storage |
| --- | --- | --- | --- |
| | trans | angle | |
| 0 | (-t/2, +h/2) | 270 | |
| 3 | (+w/2, +t/2) | 0 | |
| 6 | (+t/2, -h/2) | 90 | |
| 9 | (+w/2, +t/2) | 180 | |
| 2 | (+t/2, +t/2) | 180 | |
| 5 | (+t/2, -t/2) | 270 | |
| 8 | (-t/2, -t/2) | 0 | |
| 11 | (-t/2, +t/2) | 90 | |
| 1 | (+t/2, +h/2) | 0 | |
| 4 | (+w/2, -t/2) | 90 | |
| 7 | (-t/2, -h/2) | 180 | |
| 10 | (-w/2, +t/2) | 270 | |

FIDUCIAL MARK SEARCH USING SUB-MODELS

CROSS-REFERENCE TO RELATED APPLICATION

This application claims the benefit of U.S. Provisional Application No. 60/080,701, filed Apr. 3, 1998.

FIELD OF THE INVENTION

This invention relates to machine vision, and particularly to machine vision using sub-models.

BACKGROUND OF THE INVENTION

During PCB assembly, a circuit board is populated with electrically conductive components such as resistors, connectors, and ball grid array devices. The main goal of placing these components is to ensure that they make contact with electrically conductive solder paste that has been dispensed on the PCB, since the components are small and the connections between them are of very fine resolution. The placement of these parts, therefore, must be done with subpixel accuracy.

To accurately place these components, two items of information are needed. The first item is the location of the printed circuit board, and the second item is the location of the device being placed. The location of the printed circuit board is determined using fiducial marks that are machined on the board during the board manufacturing process. These marks must be accurately located to determine the position of the board with respect to the mechanical device placing the components.

Previous methods for locating fiducial marks on PCBs may have several limitations. These methods use correlation-based techniques that are not very robust when exposed to non-linear lighting changes, degraded fiducial marks, or fiducial marks that are smaller or larger than expected.

SUMMARY OF THE INVENTION

In one general aspect, the invention is a method for finding a pose of a geometric model of a fiducial mark within an image of a scene containing the fiducial mark. The method includes receiving input from a user including geometric model shape information and geometric model dimensions, selecting a pre-defined model having sub-models by using the model shape information, the pre-defined model being parameterized by the geometric model dimensions; and then using the pre-defined model to find an image of the fiducial mark in the image of the scene.

In a preferred embodiment, the act of selecting a pre-defined model having sub-models includes pre-defining a model such that the sub-models and the relationships among the sub-models are selected by exploiting knowledge of features and properties of the fiducial sought so as to provide more accurate location of the fiducial.

In an alternate preferred embodiment, selecting a pre-defined model having sub-models includes selecting a pre-defined model having sub-models from the group consisting of the pre-defined models shown in FIGS. 2 through 8, inclusive.

In yet another preferred embodiment, the image of the fiducial mark in the image of the scene that was found is measured to provide found fiducial measurements, and the found fiducial measurements are compared with at least one tolerance range.

Thus, the invention provides enhanced ease of use of a sub-model-based search method by requiring only the shape and dimensions of the fiducial sought. An appropriate model and it's sub-models are automatically provided. The model and it's sub-models are particularly appropriate to the application when they are based on knowledge of the variability of the fiducial, and other aspect of the behavior of the fiducial throughout a manufacturing process, for example.

The present invention uses the sub-model-based shape finder (also called the Sub-model Search Tool), as described in co-pending U.S. patent application Ser. No. 09/054,968, filed Apr. 3, 1998, entitled "Object Image Search Using Sub-Models", herein incorporated by reference, to provide more accurate and robust fiducial mark location than can typically be provided by correlation-based search techniques. Because the method of the invention exploits a robust feature extraction method, such as PatMax or CNLPAS, both sold by Cognex Corporation, it is capable of robustly locating fiducial marks under a wide variety of degraded image conditions. Thus, the present invention can find fiducials in images with non-linear lighting changes, or in images where some fiducials are partially obscured. In addition, a fiducial mark can be located in an image even if the scale of the mark is significantly different from the one being sought. Since the method of the invention uses sub-models to find fiducials, a fiducial can be located with higher accuracy than previous gray-scale correlation techniques, such as normalized correlation search.

In addition to the accuracy and robustness qualities achieved by the use of the sub-model-based shape search technique, the fiducial-finding method of the invention provides a user with the ability to describe fiducial marks not only as a region of an image, but also by its shape and geometric dimensions. The use of sub-models means that the ideal appearance of the fiducial is described and then used as the basis for finding fiducials in subsequent images. If image models are used, the model definition includes any extraneous features that appear in the particular instance of the fiducial mark. Subsequent images of fiducials might include different features produced by changes in lighting or produced by blemishes introduced in fiducial mark etching. These new features can impact the robustness with which the image's model can be located in subsequent images. By contrast, when a geometric model is used, unimportant and inconsistent features are avoided when describing the fiducial mark. Therefore, these unimportant and inconsistent features do not influence the location of the fiducial in subsequent images.

The use of geometric models by the method of the invention provides certain further benefits and advantages. Using a description of the geometry of a fiducial to be located allows selection and use of the features that are known to be reliably located under different machining conditions. Features of a fiducial that are subject to degradation, or that may be widely varying due to etching conditions, can thereby be ignored. In addition, non-linear changes in the fiducial's geometry can be described in the fiducial model. In this way, the method of the invention can be used with a robust search technique similar to PatMax, or similar to CNLPAS, both sold by Cognex Corporation, Natick Mass., under conditions where simply locating boundary features would be highly unreliable.

Using geometric models and sub-models also improves the accuracy of the known location of a found fiducial mark. Once a fiducial mark is located in an image, it's position is used to compute the board location. The position of the fiducial must be determined with respect to a physical frame of reference in order to compute the board location in this way. Since the center of a geometric model can be computed mathematically, its position can be determined more accurately than the position of an image model where the reference point is located manually in an image.

BRIEF DESCRIPTION OF THE DRAWING

The invention will be more fully understood from the following detailed description, in conjunction with the following figures, wherein.

DETAILED DESCRIPTION OF PREFERRED EMBODIMENTS

Figure 1:
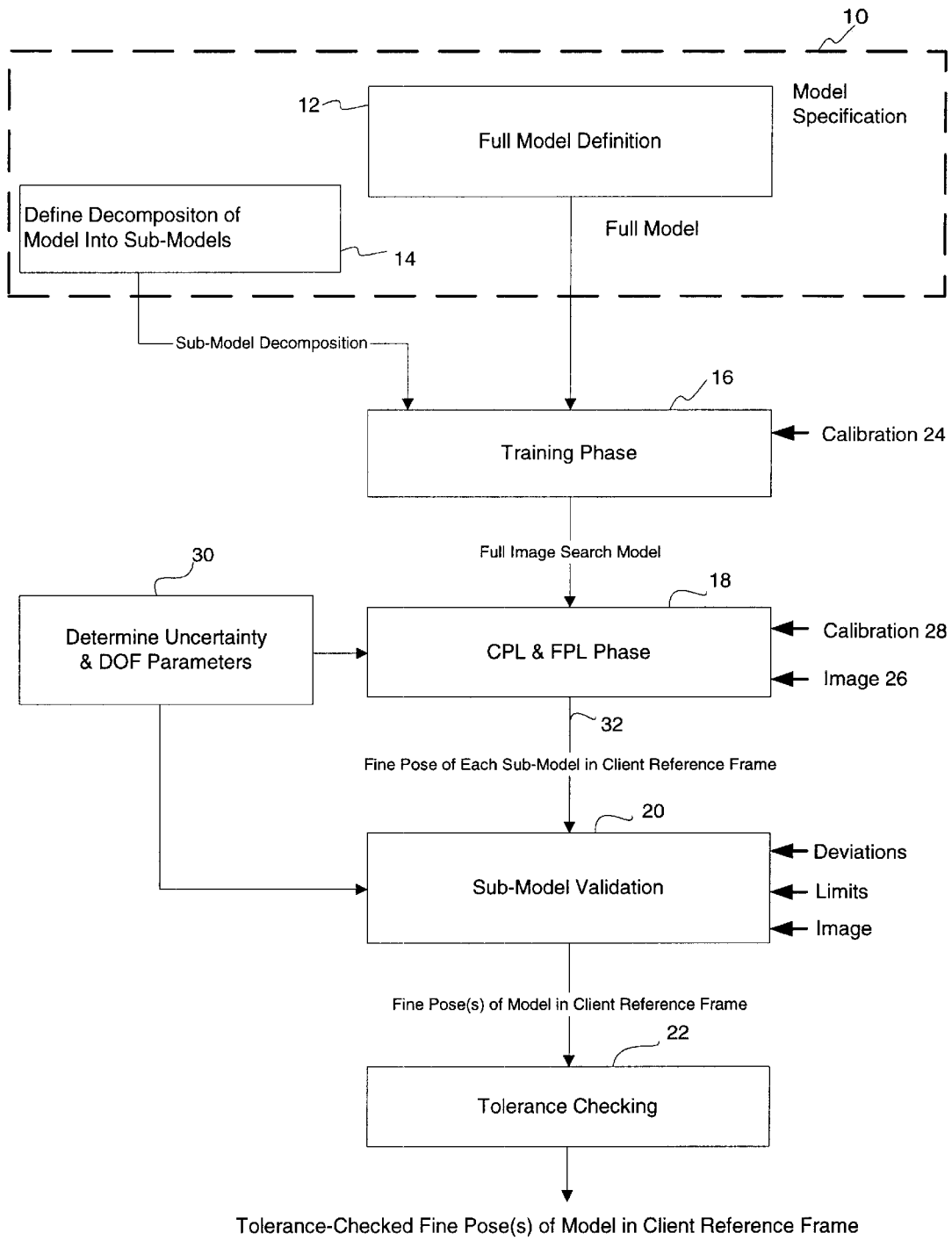
FIG. 1 is a data flow diagram of the method of the invention.

With reference to FIG. 1, a data flow diagram of an embodiment of the method of the invention is provided. Initially, the model specification step 10 occurs to define the full model 12 for the shape that the method is to find, as well as the sub-models 14 used to find the shape more accurately. After this is done, the fiducial finding method relies on the training 16, and the OPL (coarse part location) and FPL (fine part location) phases 18 of the sub-model search tool, as described in co-pending U.S. patent application Ser. No 091054,968, filed Apr. 3, 1998, entitled "Object image Search Using Sub-Models". Training 16 occurs prior to locating fiducials on an image of a printed circuit board. The CPL and FPL phases 18 are typically performed during PCB assembly. Once the results of the sub-model search tool are produced, they are typically checked for validity 20 and for adherence to tolerance specifications 22. Each of these steps will be described in more detail below.

The model specification phase 10 is uniquely defined in the fiducial finding method of the invention. It includes two steps: the definition of the full model 12, and the decomposition of this model into sub-models 14. The first step 12 uses the geometric dimensions of the fiducial shape, such as length and width, to define the full model. The fiducial model is described using the reliable features on its boundary. These features can consist of corners combined with adjoining straight edges of a rectilinear shape, or the arcs of a curvilinear shape.

The edges and arcs are then decomposed into sub-models 14. This decomposition is specified in the manner described in the co-pending patent application entitled "Object Image Search Using Sub-models". FIGS. 2a–8a depict some preferred examples of how the full model of each of the fiducial shapes can be defined, and how a fiducial shape can be decomposed into sub-models.

The list of sub-models is then used to train 16 the sub-model search in the manner described in the co-pending patent application entitled "Object Image Search Using Sub-models". When the image search models are trained 16, an option available in the Sub-model Search Tool is specified to mask out the corners. The corner masking is used because the fiducial etching process often rounds the corners, which means that the corners are unreliable features for shape finding. A calibration is also input 24 to the training step 16. This calibration 24 defines a transformation between image space and physical space. This calibration can be defined using a calibration vision tool, for example, Cognex's SMD/PGP calibration method. Note that a calibration transformation may be the identity transformation (client reference frame equals image reference frame). The client frame reference frame used in the Sub-model Search Tool is defined by the fiducial finding method of the invention as the reference frame of physical space.

Once training 16 is performed, the fiducial shape can be located in an actual image 26. First, the calibration used at runtime 28 is checked to determine if it is different than the calibration 24 used for training. If it is, the Sub-model Search Tool is retrained 16. Once training is current, the degrees-of-freedom 30 used in the shape tool (CPL, FPL 18, and final fit (see FIG. 9)) phases are determined. The method flow diagram of FIG. 9 shows the details of this process, and is described in more detail below.

Figure 9:
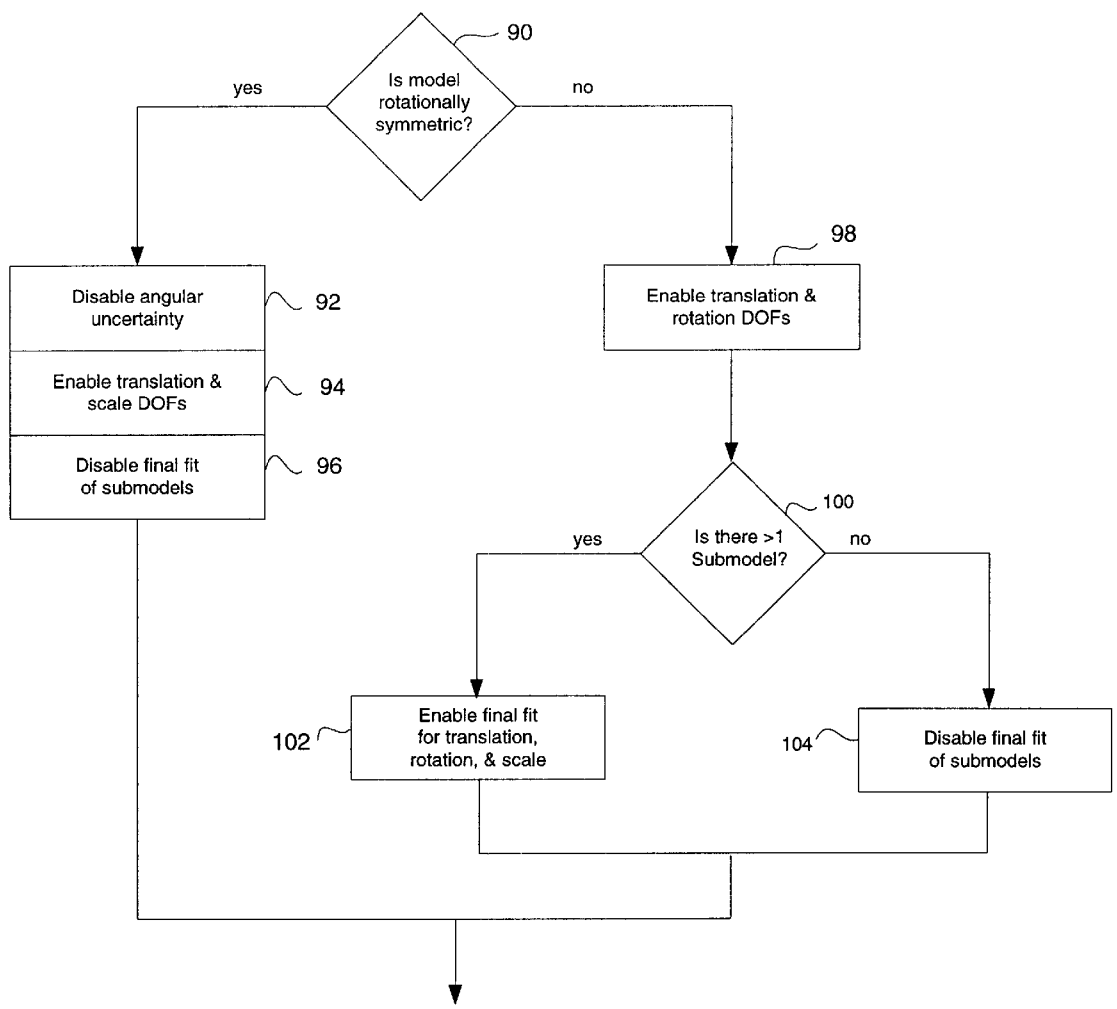
FIG. 9 is a flow diagram of an embodiment of a method for determining uncertainty and degree-of-freedom (DOF) parameters.

Referring to FIG. 9, first, the rotational symmetry of the shape is determined 90. A shape is defined as rotationally symmetric if any point on the boundary maps to another boundary point when the shape is rotated about its centroid. Put more simply, shapes that consist entirely of one or more circles sharing the same center are rotationally symmetric. If a shape is rotationally symmetric, then angular uncertainly is disabled 92 for the CPL phase 18, translation and scale degrees of freedom are enabled 94 for the FPL phase 18. and final fit of found sub-models is disabled 96. The final fit is not needed because the sub-models are constrained to move together as a unit.

If the shape is not rotationally symmetric, then all uncertainty ranges are used for the CPL phase, and the translation and rotation degrees of freedom are used 98 for the FPL phase. If there is more than one sub-model 100, then the final fit of sub-models is enabled 102 for the translational, rotational, and scale degrees-of-freedom. This helps to account for changes in the interrelationships among independent sub-models. Otherwise, the final fit of sub-models is disabled 104.

These parameters 30 along with the user-specified inputs (runtime image 26 and the uncertainty ranges 30 for the angle, scale, and aspect) are passed into the shape tool 18. The results 32 of how many fiducials are found in one image are obtained from the tool and further processed. If no results are returned, an error is indicated. If the number of results returned is less than the number requested, error information is stored. For all results found, the existing sub-results and vertex information are stored.

The resulting FPL pose 32 of the full model in physical space and the statistics and poses (in client spaces) of each sub-model are input to the sub-model validation step 20, the step 20 preferably using the methods described in patent application Ser. No. 09/212,844, filed Dec. 16, 1998, entitled "Improved Object Image Search Using Validated Sub-model Poses", herein incorporated by reference.

The found fiducial's dimensions are then determined using the final fine pose of the full model in client space (particularly the scale factors), and the dimensions of the full model itself are checked 22 to determine if they exceed user-specified tolerances. The found fiducial's dimensions can be determined in many ways know to those skilled in the vision art, such as by using a measurement vision tool, such as CALIPER, sold by Cognex Corporation, or a sub-model-based measurement vision tool, such as described in co-pending patent application Ser. No. 09/140,124, filed Aug. 25, 1998, entitled "Gauging Using Sub-Model Poses", herein incorporated by reference.

FIGS. 2 through 8 will now be discussed. The models and associated sub-models shown in these figures have been pre-defined such that the sub-models and the relationships among the sub-models are selected using knowledge of features and properties of the fiducial sought, thereby providing more accurate location of the fiducial. For example, the sub-models of the model can be selected so as to avoid areas of the fiducial that are susceptible to degradation during the manufacturing process of a printed circuit board bearing the fiducial. Sub-models can also be selected to accommodate variability of fiducials on boards originating from a wide range of manufacturers, or to accommodate fiducial feature variability due to manufacturing process variations, or any other source of fiducial feature variability.

Figure 2A:
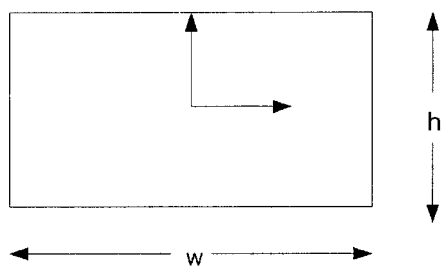
FIG. 2a is a client-labeled rectangle model, and an exemplary decomposition of the model into sub-models.
Figure 2B:
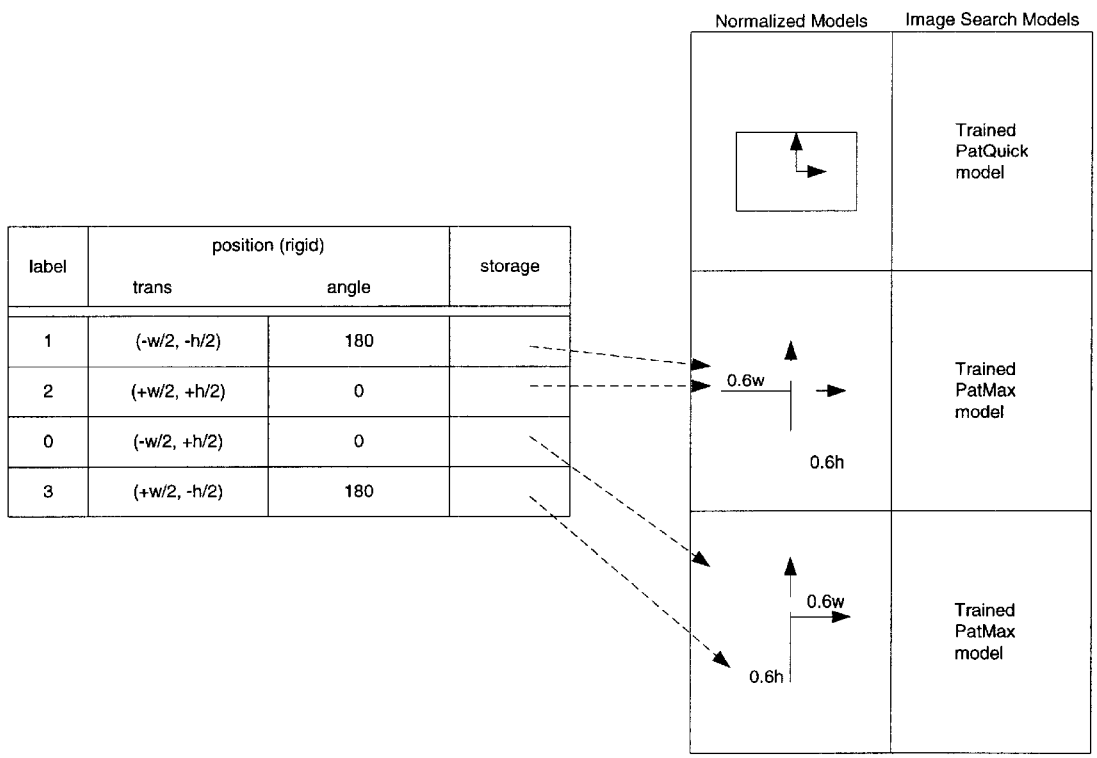
FIG. 2b is a sub-model table for the rectangle model of FIG. 2a containing automatically labeled shape, and an associated model storage table.

For example, FIG. 2a is a client-labeled rectangle model, and an exemplary decomposition of the model into sub-models, and FIG. 2b is a sub-model table for the rectangle model of FIG. 2a containing automatically labeled shape, and an associated model storage table. Note that although explicit preferred percentages are provided for defining sub-models 0, 1, 2, and 3, these percentages are merely exemplary, and many other percentages could be used and still fall within the scope of the invention. The optimum percentages will vary in accordance with the specific application of the invention.

Figure 3A:
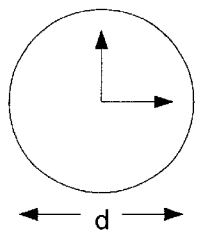
FIG. 3a is a client-labeled circle model, and an exemplary decomposition of the model into sub-models.
Figure 3B:
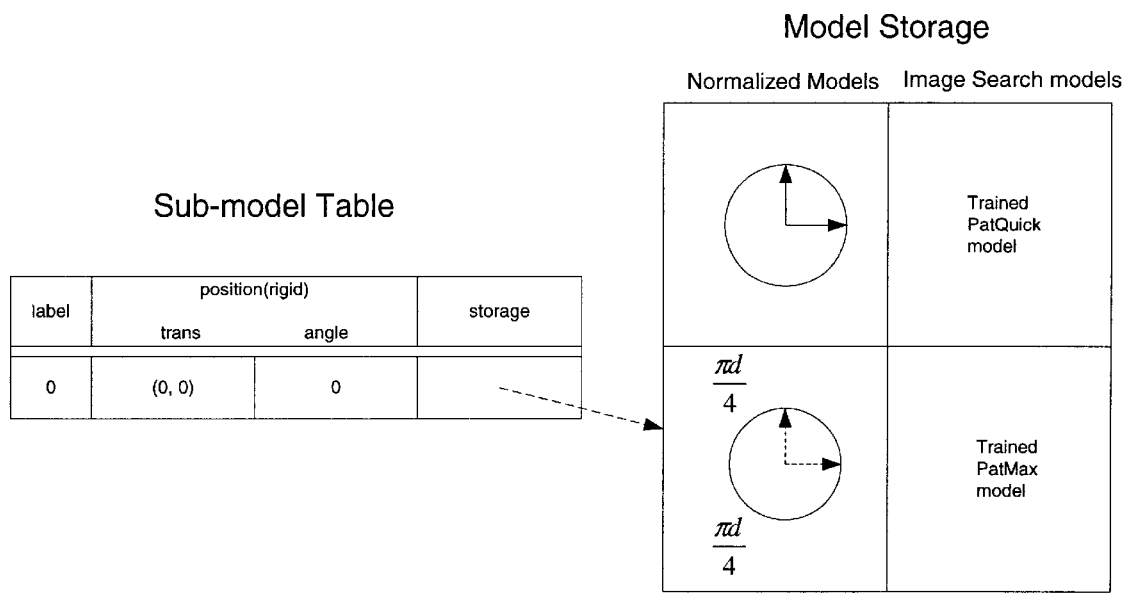
FIG. 3b is a sub-model table for the circle model of FIG. 3a containing automatically labeled shape, and an associated model storage table.

FIG. 3a is a client-labeled circle model, and an exemplary decomposition of the model into sub-models; and FIG. 3b is a sub-model table for the circle model of FIG. 3a containing automatically labeled shape, and an associated model storage table.

Figure 4A:
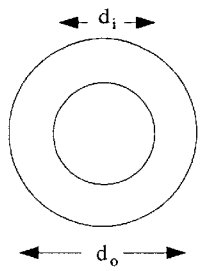
FIG. 4a is a client-labeled annulus model, and an exemplary decomposition of the model into sub-models.
Figure 4B:
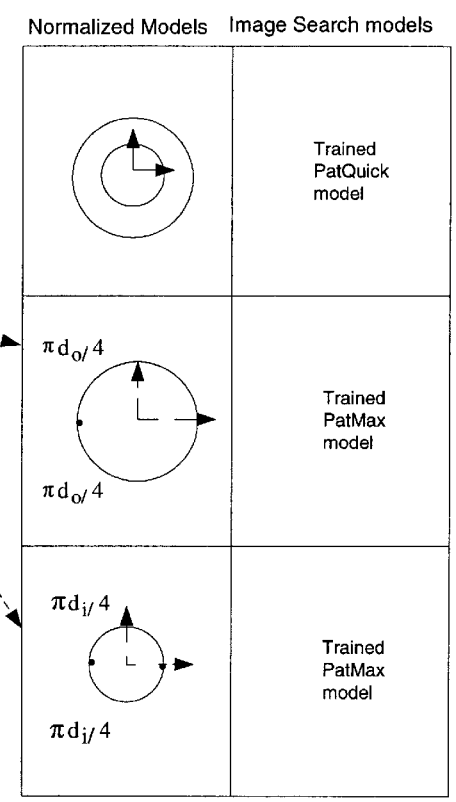
FIG. 4b is a sub-model table for the annulus model of FIG. 4a containing automatically labeled shape, and an associated model storage table.

FIG. 4a is a client-labeled annulus model, and an exemplary decomposition of the model into sub-models, and FIG. 4b is a sub-model table for the annulus model of FIG. 4a containing automatically labeled shape, and an associated model storage table.

Figures 5A, 5B:
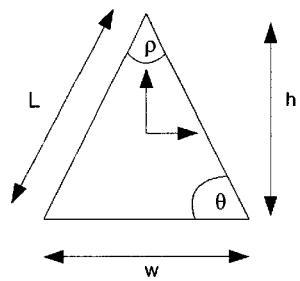
FIG. 5a is a client-labeled triangle model, and an exemplary decomposition of the model into sub-models.
FIG. 5b is a sub-model table for the triangle model of FIG. 5a containing automatically labeled shape, and an associated model storage table.

FIG. 5a is a client-labeled triangle model, and an exemplary decomposition of the model into sub-models, and FIG. 5b is a sub-model table for the triangle model of FIG. 5a containing automatically labeled shape, and an associated model storage table.

Figure 6A:
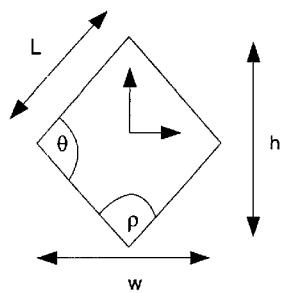
FIG. 6a is a client-labeled diamond model, and an exemplary decomposition of the model into sub-models.
Figure 6B:
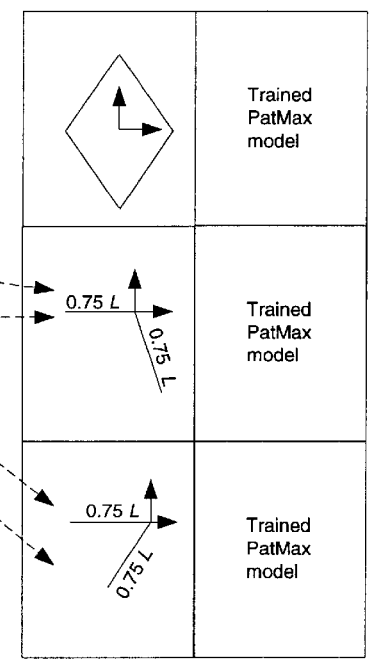
FIG. 6b is a sub-model table for the diamond model of FIG. 6a containing automatically labeled shape, and an associated model storage table.

FIG. 6a is a client-labeled diamond model, and an exemplary decomposition of the model into sub-models, and FIG. 6b is a sub-model table for the diamond model of FIG. 6a containing automatically labeled shape, and an associated model storage table.

Figure 7A:
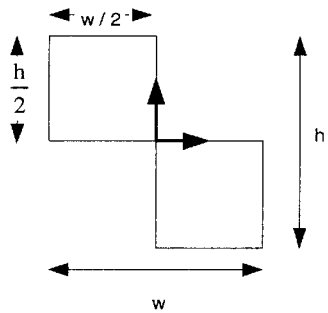
FIG. 7a is a client-labeled double rectangle model, and an exemplary decomposition of the model into sub-models.
Figure 7B:
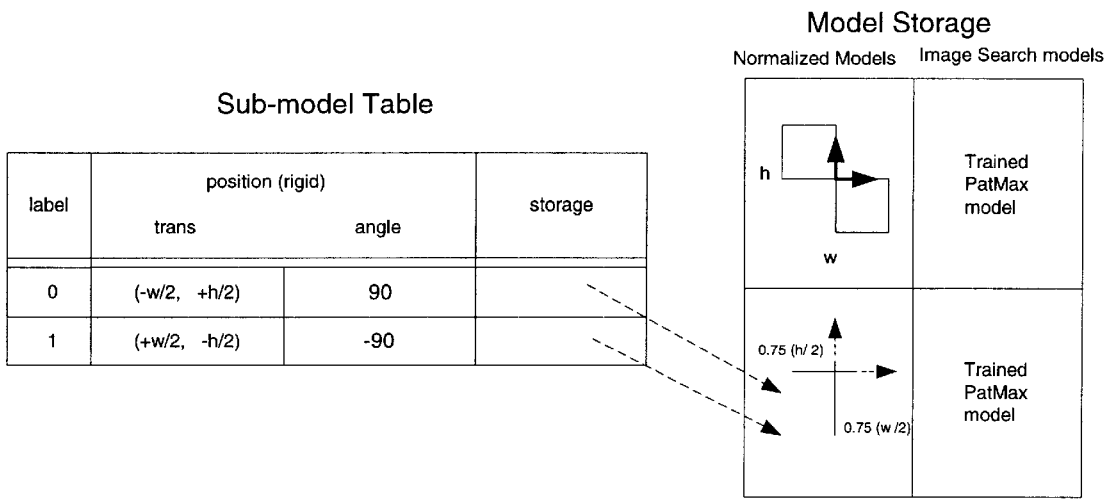
FIG. 7b is a sub-model table for the double rectangle model of FIG. 7a containing automatically labeled shape, and an associated model storage table.

FIG. 7a is a client-labeled double rectangle model, and an exemplary decomposition of the model into sub-models, and FIG. 7b is a sub-model table for the double rectangle model of FIG. 7a containing automatically labeled shape, and an associated model storage table.

Figure 8A:
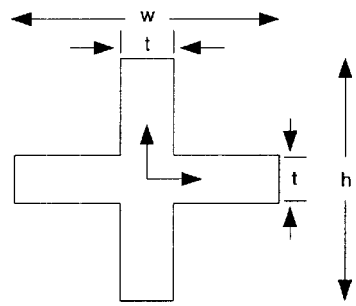
FIG. 8a is a client-labeled cross model, and an exemplary decomposition of the model into sub-models.
Figure 8B:
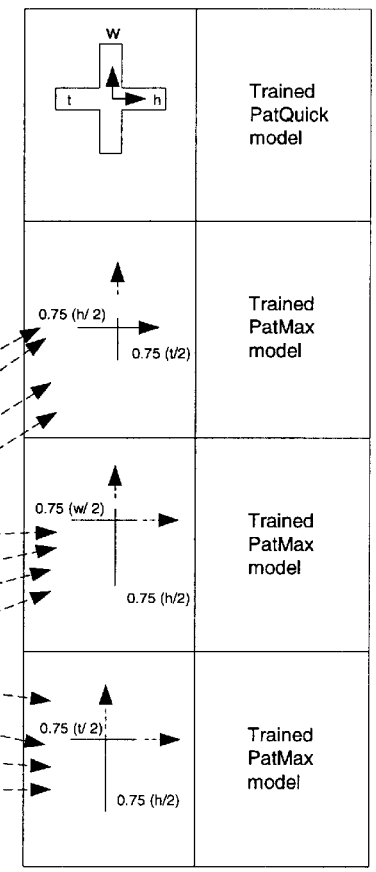
FIG. 8b is a sub-model table for the cross model of FIG. 8a containing automatically labeled shape, and an associated model storage table.

FIG. 8a is a client-labeled cross model, and an exemplary decomposition of the model into sub-models, and FIG. 8b is a sub-model table for the cross model of FIG. 8a containing automatically labeled shape, and an associated model storage table.

Other modifications and implementations will occur to those skilled in the art without departing from the spirit and the scope of the invention as claimed. Accordingly, the above description is not intended to limit the invention except as indicated in the following claims.

What is claimed is:

1. A method for finding a pose of a geometric model of a fiducial mark within an image of a scene containing the fiducial mark, the method comprising:

receiving input from a user including geometric model shape information and geometric model dimensions;

using the model shape information, selecting a pre-defined model having sub-models from the group consisting of the pre-defined models shown in FIGS. 2 through 8 inclusive, the pre-defined model being parameterized by the geometric model dimensions; and using the pre-defined model to find an image of the fiducial mark in the image of the scene.

* * * * *